United States Patent [19]

Stroud

[11] Patent Number: 5,936,470
[45] Date of Patent: Aug. 10, 1999

[54] AUDIO AMPLIFIER HAVING LINEAR GAIN CONTROL

[75] Inventor: Richard Sidney Stroud, Kokomo, Ind.

[73] Assignee: Delco Electronics Corporation, Kokomo, Ind.

[21] Appl. No.: 08/987,958

[22] Filed: Dec. 10, 1997

[51] Int. Cl.$^6$ .................................................... H03G 3/10
[52] U.S. Cl. ........................................... 330/284; 330/282
[58] Field of Search .................................. 330/284, 282, 330/86, 145

[56] References Cited

U.S. PATENT DOCUMENTS

| | | | |
|---|---|---|---|
| 3,451,006 | 6/1969 | Grangaard, Jr. | 330/69 |
| 4,134,079 | 1/1979 | Kohtani | 330/281 |
| 4,415,803 | 11/1983 | Muoi | 250/214 A |
| 4,450,413 | 5/1984 | Fujibayashi | 330/279 |
| 4,459,555 | 7/1984 | Jett, Jr. | 330/253 |
| 4,476,439 | 10/1984 | Sato | 330/254 |
| 4,563,656 | 1/1986 | Baum | 330/149 |
| 4,785,257 | 11/1988 | Yokoyama | 330/149 |
| 5,045,910 | 9/1991 | Villa | 357/35 |
| 5,327,101 | 7/1994 | Neely et al. | 330/284 |
| 5,387,877 | 2/1995 | Robinson | 330/254 |
| 5,426,394 | 6/1995 | Choik | 330/149 |

*Primary Examiner*—Robert Pascal
*Assistant Examiner*—Henry Choe
*Attorney, Agent, or Firm*—Jimmy L. Funke

[57] ABSTRACT

An audio amplifier having an improved bi-polar transistor variable impedance circuit which is inexpensive to implement and which exhibits improved linearity. The resistance characteristic of the circuit is linearized with respect to the input signal strength through the addition of a diode between the control voltage and the base of the bi-polar transistor. This simple and inexpensive combination significantly improves the resistance linearity, allowing the transistor to handle significantly higher input signal voltages without increasing the output signal distortion. Additionally, the linearity of the control voltage response is improved through the addition of a second transistor-diode combination connected in current-mirroring relationship to the variable impedance transistor-diode combination. This circuit is particularly useful in applications requiring a wide-range open-loop control, such as a volume or tone control.

4 Claims, 3 Drawing Sheets

5,936,470

AUDIO AMPLIFIER HAVING LINEAR GAIN CONTROL

This invention relates to a gain control circuit for an audio amplifier, and more particularly to a controlled resistance element having improved linearity.

BACKGROUND OF THE INVENTION

In audio amplifier circuits, variable gain elements are commonly used to control the level or frequency response of an input signal. The variable gain element typically includes a transistor connected to variably attenuate the input signal, and a control circuit for suitably biasing the transistor. FIGS. 1A–1B illustrate various prior art circuits. FIG. 1A shows an open-loop gain control circuit which might be used to implement a tone or volume control, and FIG. 1B shows a closed-loop gain control circuit, which might be used to implement a gain limiter.

Referring to FIGS. 1A–1B, an audio input signal Vin present at terminal 10 is AC-coupled via capacitor 12 to an amplifier comprising the input resistors 14, 16, the operational amplifier 18 and the feedback resistor 20. The inverting input of the amplifier 18 is coupled to the junction of resistors 16 and 20, while the non-inverting input is coupled to a bias voltage Vbias, such as one-half of the supply voltage Vcc. The amplified output signal, Vout, appears at terminal 22. The variable resistance element, bi-polar transistor 24, couples the input signal at junction 15 to the bias voltage Vbias. The conduction of transistor 24, and hence its effective resistance, varies in accordance with a control voltage developed at terminal 26. In the circuit of FIG. 1A, the control voltage is developed open-loop by a variable DC voltage source 28, whereas in the circuit of FIG. 1B, the control voltage is developed closed-loop by a feedback circuit 28 connected to the output of amplifier 18.

While the above-described circuits require only a single control element (transistor 24) and are therefore inexpensive to implement, they exhibit a resistance characteristic that varies non-linearly with input signal strength, tending to limit their usefulness to relatively small input signal voltages. In a practical mechanization, for example, the transistor 24 has been limited to input voltages of 15–20 mV peak-to-peak in order to realize acceptably low output signal distortion. Additionally, the above-described circuits tend to exhibit a relatively abrupt and non-linear response to the control voltage. While this characteristic may be acceptable in certain closed-loop applications, it is undesirable in many open-loop applications.

SUMMARY OF THE PRESENT INVENTION

The present invention is directed to an audio amplifier having an improved bi-polar transistor variable impedance circuit which is inexpensive to implement and which exhibits improved linearity.

According to a first embodiment of this invention, the resistance characteristic of the circuit is linearized with respect to the input signal strength through the addition of a diode between the control voltage and the base of the bi-polar transistor. This simple and inexpensive combination significantly improves the resistance linearity, allowing the transistor to handle significantly higher input signal voltages while maintaining an acceptably low level of output signal distortion.

According to a second embodiment of this invention, the control voltage response is linearized through the addition of a second transistor connected in current-mirroring relationship to the variable impedance transistor. This circuit is particularly useful in applications requiring a wide-range open-loop control, such as a volume or tone control.

BRIEF DESCRIPTION OF THE DRAWINGS

FIG. 1A depicts an open-loop control, whereas FIG. 1B depicts a closed-loop control.

DETAILED DESCRIPTION OF THE DRAWINGS

Figure 1A:
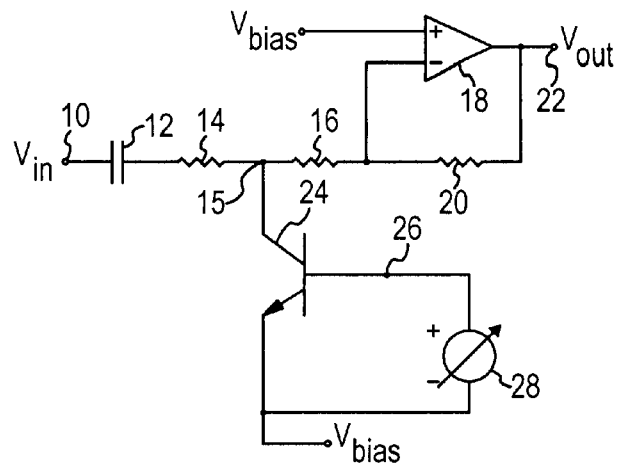
FIGS. 1A and 1B depict prior art variable gain amplifier circuits.
Figure 1B:
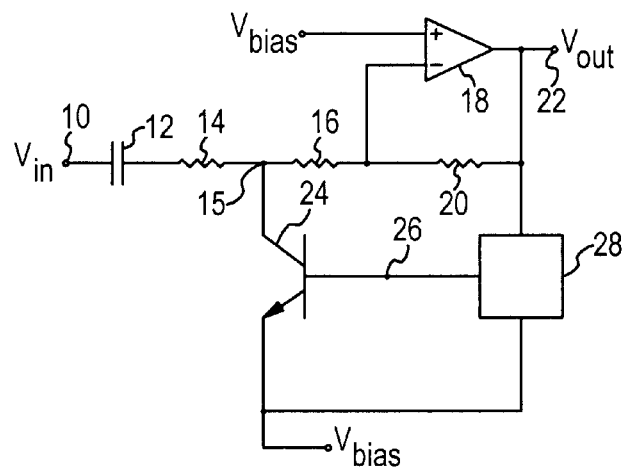
Figure 2:
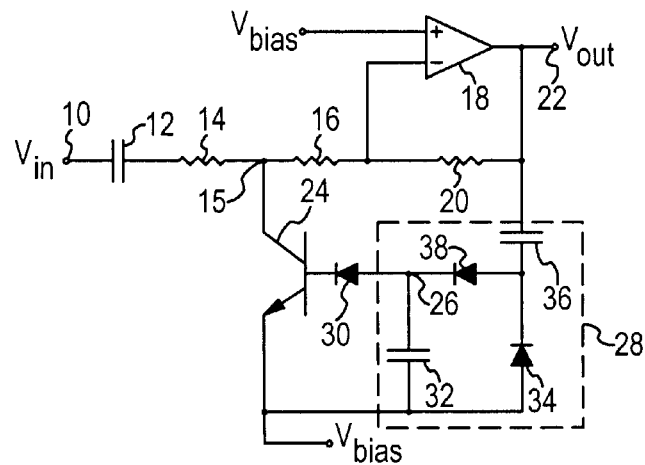
FIG. 2 is a closed-loop variable gain audio amplifier circuit in accordance with a first embodiment of this invention.

A first embodiment of this invention is depicted in FIG. 2 in the context of a closed-loop variable gain control, such as a dynamic distortion limit circuit. Circuit elements corresponding to the above-described circuits of FIGS. 1A–1B have been assigned the same reference numerals. Additionally, the control voltage source 28 is depicted in detail, and the variable impedance circuit includes a diode 30 connected between the control voltage terminal 26 and the base of transistor 24. The control voltage source 28 develops a control voltage across capacitor 32 in accordance with the peak-to-peak voltage of output voltage Vout. In negative half cycles of Vout, the diode holds the low side of capacitor 36 to a diode drop above the bias voltage Vbias, and in positive half cycles, the stored capacitor voltage and the peak value of vout are transferred to capacitor 32 via diode 38.

As will be appreciated from the foregoing, the only significant difference between the circuits of FIGS. 1A–1B and the circuit of FIG. 2 is the addition of diode 30. Without diode 30, the transistor 24 exhibits a resistance characteristic that varies non-linearly with larger input signal strengths. Waveform signal distortion is evident when signals across the variable resistance circuit exceed levels of only 8–10 mV. Although the resistor values may be changed to reduce the signal voltage at junction 15, the required changes tend to increase the input impedance, which typically increases susceptibility to noise.

However, the addition of diode 30 significantly improves the linearity of the resistance characteristic provided by transistor 24, allowing the circuit to operate with minimal input waveform distortion at significantly increased input signal voltages. In a mechanization of the invention, the circuit performed well with input signal voltages as high as 60–80 mV peak-to-peak, as compared with a maximum of only 15–20 mV peak-to-peak with the circuits of FIGS. 1A–1B.

Figure 3A:
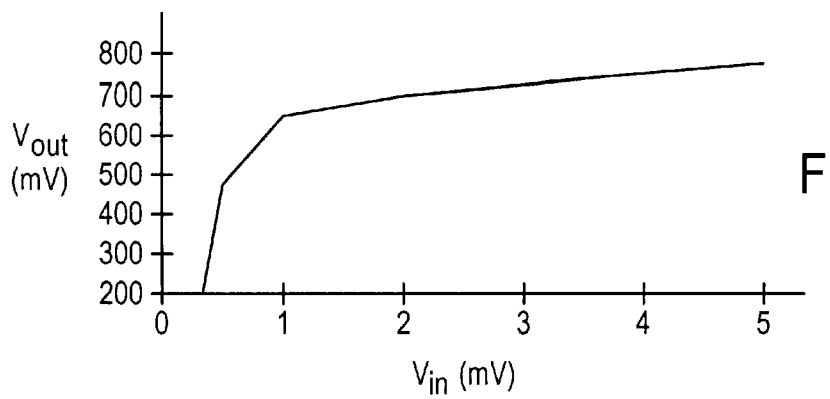
FIGS. 3A and 3B are graphs depicting the operation of the amplifier circuit of FIG. 2.
Figure 3B:
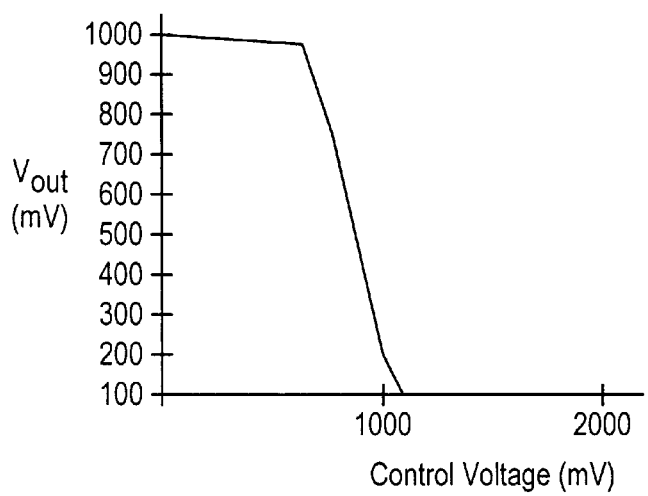

The performance is graphically depicted in FIG. 3A which depicts the output voltage Vout as a function of input voltage Vin, and in FIG. 3B which depicts the output voltage Vout as a function of the control voltage at terminal 26. As seen in FIG. 3A, the circuit exhibits a gain approaching unity for low-level input signals and begins reducing gain at input signal levels of approximately 600 mV. This "soft-limiting" property is acceptable for most limiter applications. FIG. 3B demonstrates the abrupt nature of the diode-transistor variable resistance element. This is generally of little consequence in a feedback circuit.

Figure 4:
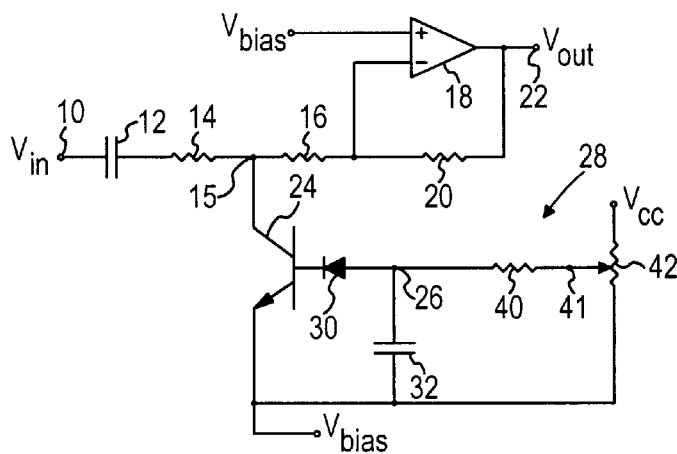
FIG. 4 is an open-loop variable gain audio amplifier circuit in accordance with the first embodiment of this invention.
Figure 5:
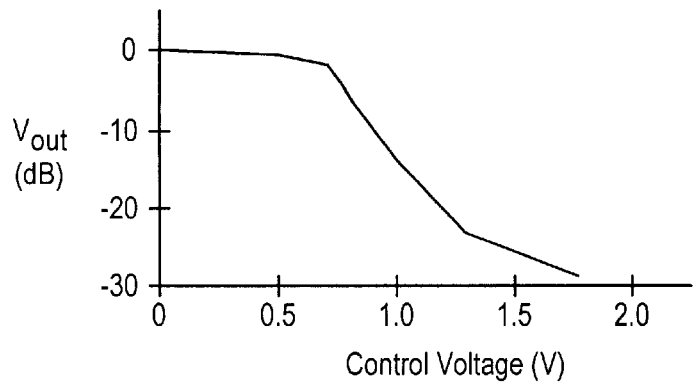
FIG. 5 is a graph depicting the operation of the amplifier circuit of FIG. 4.

FIG. 4 illustrates the variable resistance circuit of FIG. 2 implemented in the context of an open loop variable gain control in which the control voltage at terminal 26 is set by an input resistor 40 and a potentiometer 42 connected between the supply voltage Vcc and the bias voltage Vbias. A capacitor 32 is required to provide a robust control voltage that is substantially insensitive to variations in the input signal strength. The response characteristic of this circuit is shown in FIG. 5, which depicts the attenuation of Vout in dB as a function of the control voltage, as measured at junction 41 between input resistor 40 and potentiometer 42. While the circuit uses only a few parts, the abrupt turn-on characteristic shown in FIG. 3B manifests itself as a system property shown in the graph of FIG. 5. Additionally, capacitor 32 and resistor 40 cause a time delay which could impair reaction time in some signal processing applications.

Figure 6:
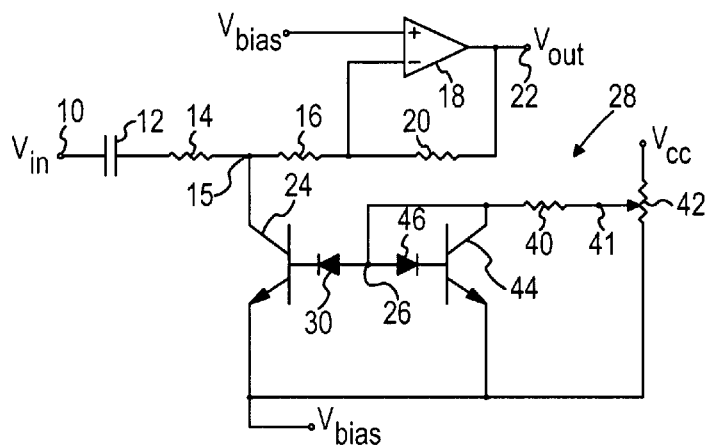
FIG. 6 is an open-loop variable gain audio amplifier circuit in accordance with a second embodiment of this invention.
Figure 7:
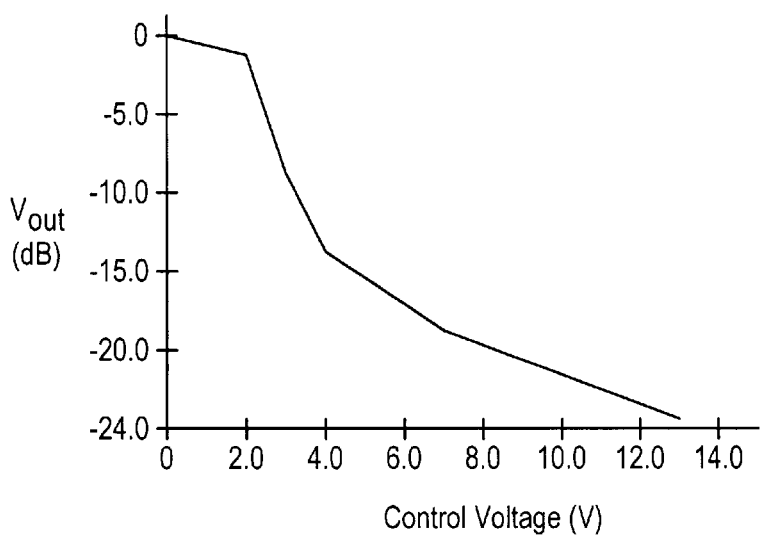
FIG. 7 is a graph depicting the operation of the amplifier circuit of FIG. 6.

The rather abrupt response characteristic observed in FIG. 5 may be softened in accordance with a second embodiment of this invention, depicted in FIG. 6, where a second bi-polar transistor 44 matched with the transistor 24 is connected a current mirror topology with transistor 24. That is, the collector of transistor 44 is coupled to the control voltage terminal 26, the emitter of transistor 44 is coupled to the emitter of transistor 24, and the base of transistor 44 is connected to the control voltage terminal 26 via a matching diode 46. In this circuit, the control voltage determines the current in transistor 44, and that same current is mirrored in transistor 24, resulting in a significantly more linear relationship between the control voltage and the effective resistance presented to the amplifier circuit by transistor 24. The response characteristic of this circuit is shown in FIG. 7, which depicts the attenuation of Vout in dB as a function of the control voltage, as measured at junction 41 between input resistor 40 and potentiometer 42. As compared with the graph of FIG. 5, it will be seen that the relationship between output attenuation and control voltage is substantially linearized, particularly taking into consideration the compressed control voltage scale of FIG. 7. This makes the circuit ideally suited for open-loop control applications, such as volume or tone control, and may offer advantages in closed-loop applications where improved linearity of control signal characteristic is desired.

An additional advantage of the circuit of FIG. 6 is that the current mirror topology obviates the need for capacitor 32, as may be seen by comparing FIGS. 4 and 6. This not only offsets the cost of the additional transistor 40 and diode 46, but it also eliminates any phase shift introduced by capacitor 32. This improves the stability of closed-loop applications.

Additionally, the elimination of capacitor 32 improves the circuit response time, making the circuit advantageous in applications requiring a fast response, such as modulation limiting. A further advantage of the circuit of FIG. 6 is that the mirroring of transistor 24 and diode 30 by transistor 44 and diode 46 improves the temperature stability of the characteristic illustrated in FIG. 7.

In summary, this invention significantly improves the range of operation and control linearity of variable gain audio amplifier circuits without appreciably increasing their cost. While the control circuits have been described in reference to the illustrated embodiments, it will be understood that various modifications will occur to persons skilled in the art. For example, the circuits may be referenced to ground potential as opposed to the bias voltage Vbias, and PNP devices may be used in place of the illustrated NPN devices. Accordingly, it will be appreciated that circuits incorporating these and other modifications may fall within the scope of this invention, which is defined by the appended claims.

The embodiments of the invention in which an exclusive property or privilege is claimed are defined as follows:

1. An audio amplifier circuit comprising:

an amplifier adapted to receive an audio input voltage and to produce an audio output voltage that is related to the input voltage by a nominal gain characteristic of the amplifier;

a variable impedance element including a first bi-polar transistor having an emitter-collector circuit coupling the audio input voltage to a reference potential and a first diode coupling a control voltage to a base of said first bi-polar transistor, and a second transistor connected in current mirror relationship with respect to said first transistor, such that a current established in said second transistor by said control voltage is mirrored in said first transistor to variably attenuate said nominal gain characteristic in substantially linear relationship to said control voltage; and a control circuit for generating said control voltage in relation to a desired attenuation of said nominal gain characteristic.

2. The audio amplifier circuit of claim 1, wherein said control circuit develops said control voltage in relation to the magnitude of said audio output voltage.

3. The audio amplifier circuit of claim 1, wherein said control voltage is coupled to a base of said second transistor through a second diode.

4. The audio amplifier circuit of claim 3, wherein an emitter of said second transistor is connected to an emitter of said first transistor, a collector of said second transistor is connected to said control voltage, and said second diode is connected between the control voltage and a base of said second transistor.

* * * * *